United States Patent
Toba et al.

(10) Patent No.: US 9,947,651 B2
(45) Date of Patent: Apr. 17, 2018

(54) SEMICONDUCTOR INTEGRATED CIRCUIT DEVICE HAVING AN NMOS WITH A HIGH RESISTANCE DRAIN TERMINAL

(71) Applicant: Renesas Electronics Corporation, Kawasaki-shi, Kanagawa (JP)

(72) Inventors: Takeo Toba, Tokyo (JP); Kazuo Tanaka, Tokyo (JP); Hiroyasu Ishizuka, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 13/910,891

(22) Filed: Jun. 5, 2013

(65) Prior Publication Data

US 2013/0264647 A1    Oct. 10, 2013

Related U.S. Application Data

(63) Continuation of application No. 12/642,760, filed on Dec. 18, 2009, now abandoned.

(30) Foreign Application Priority Data

Dec. 19, 2008    (JP) .................................. 2008-323589

(51) Int. Cl.
*H01L 27/092*    (2006.01)
*H01L 27/02*    (2006.01)
(Continued)

(52) U.S. Cl.
CPC .......... *H01L 27/0292* (2013.01); *H01L 24/06* (2013.01); *H01L 27/0207* (2013.01);
(Continued)

(58) Field of Classification Search
CPC ..... H01L 23/60; H01L 23/62; H01L 27/0266; H01L 27/0288; H01L 27/0292; H01L 27/0296; H01L 23/5286; H01L 23/647
(Continued)

(56) References Cited

U.S. PATENT DOCUMENTS 5,985,722 A * 11/1999 Kishi .............................. 438/275
6,653,709 B2 * 11/2003 Wu ................. H01L 21/823814
257/355

(Continued)

FOREIGN PATENT DOCUMENTS

| JP | 11-261011 A | 9/1999 |
| JP | 2006-049846 A | 2/2006 |

(Continued)

OTHER PUBLICATIONS

Office Action dated Jul. 11, 2014, in Taiwanese Application No. 098139554.
(Continued)

*Primary Examiner* — Anh Mai
(74) *Attorney, Agent, or Firm* — Shapiro, Gabor and Rosenberger, PLLC

(57) ABSTRACT

A semiconductor integrated circuit device with a "PAD on I/O cell" structure in which a pad lead part is disposed almost in the center of an I/O part so as to reduce the chip layout area. In the I/O part, a transistor lies nearest to the periphery of the semiconductor chip. When seen in a plan view of the I/O part, a resistance lies above the transistor and a first and a second diode lie above the resistance; a second transistor lies above the diodes; and a logic block lies above the second transistor with a pad lead part, for example, formed in a metal wiring layer, therebetween. This permits (Continued)

the pad through the second transistor to be on the same node and therefore the pad lead part can be disposed almost in the center of the I/O part.

7 Claims, 19 Drawing Sheets

(51) Int. Cl.
    *H01L 23/00*     (2006.01)
    *H01L 27/118*     (2006.01)

(52) U.S. Cl.
    CPC .... *H01L 27/0251* (2013.01); *H01L 27/11898* (2013.01); *H01L 2224/05553* (2013.01); *H01L 2924/1301* (2013.01); *H01L 2924/13091* (2013.01); *H01L 2924/14* (2013.01)

(58) Field of Classification Search
    USPC .................. 257/355, 360, E27.016, 0.033
    See application file for complete search history.

(56) References Cited

U.S. PATENT DOCUMENTS

| | | |
|---|---|---|
| 2006/0001101 A1 | 1/2006 | Hirata |
| 2007/0120258 A1 | 5/2007 | Hayashi et al. |
| 2008/0111255 A1 | 5/2008 | Matsuoka |
| 2008/0303093 A1 | 12/2008 | Sai |

FOREIGN PATENT DOCUMENTS

| | | |
|---|---|---|
| JP | 2007-42718 | 2/2007 |
| JP | 2007-150150 | 6/2007 |
| JP | 2007-227665 | 9/2007 |
| JP | 2008-141168 A | 6/2008 |
| TW | 200735277 | 9/2007 |

OTHER PUBLICATIONS

Office Action dated Jul. 16, 2013, in Japanese Patent Application No. 2008-323589.
Office Action dated Sep. 8, 2015, in Japanese Application No. 2014-170681.

\* cited by examiner

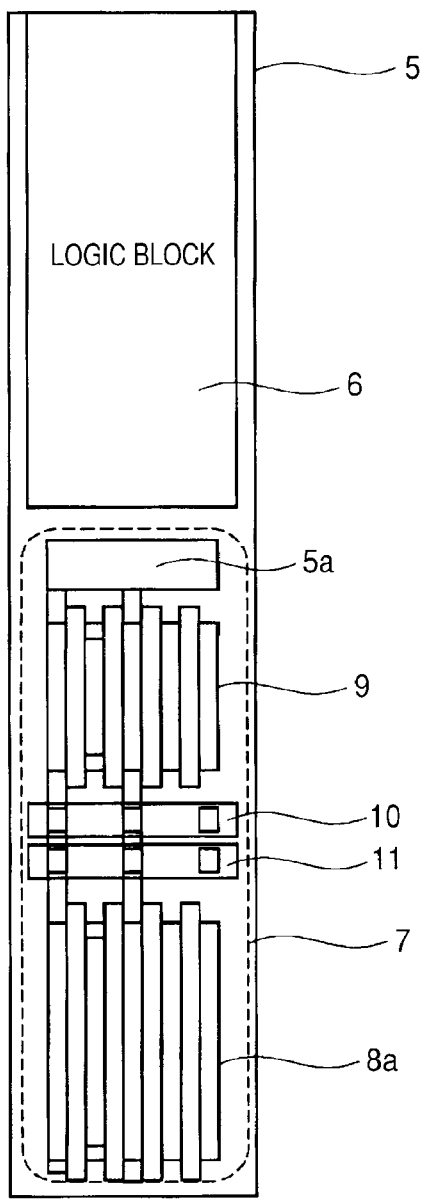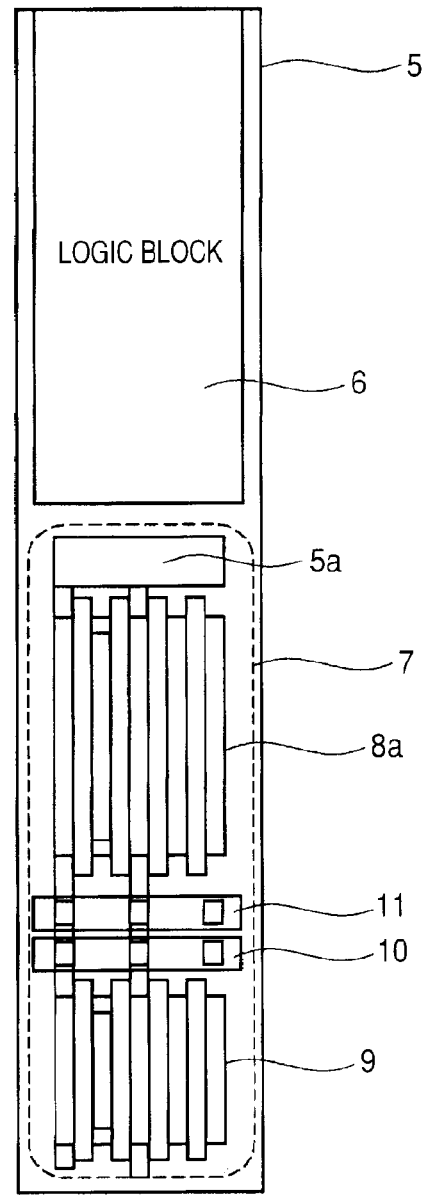

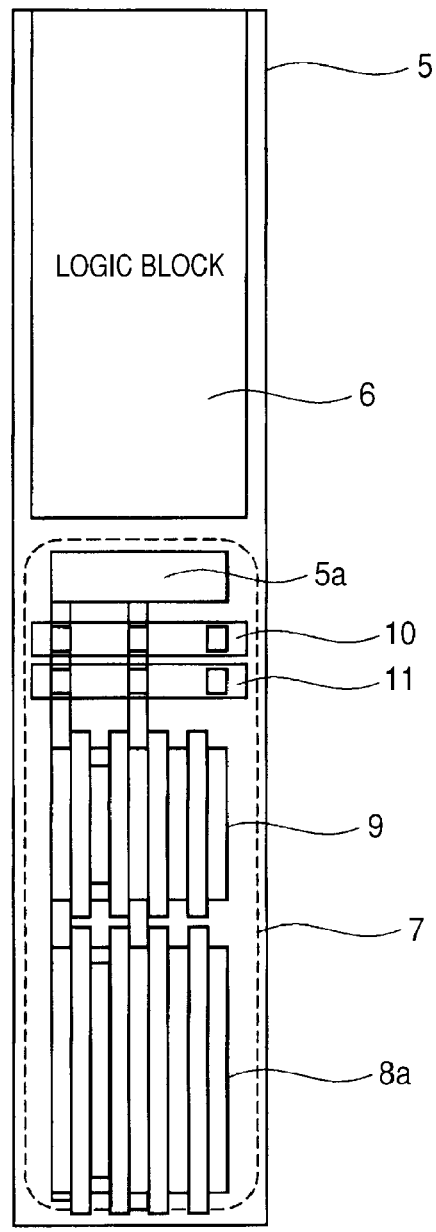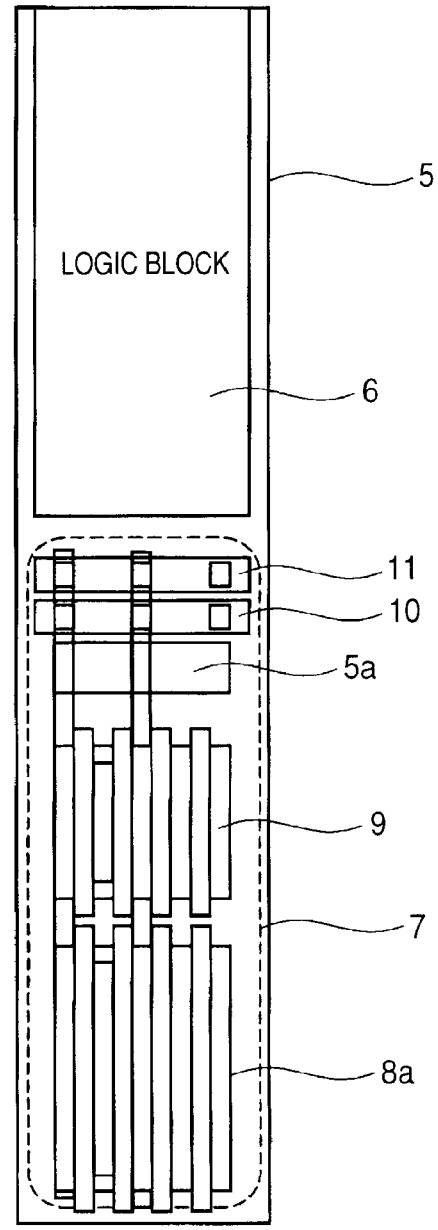

SEMICONDUCTOR INTEGRATED CIRCUIT DEVICE HAVING AN NMOS WITH A HIGH RESISTANCE DRAIN TERMINAL

CROSS-REFERENCE TO RELATED APPLICATIONS

The disclosure of Japanese Patent Application No. 2008-323589 filed on Dec. 19, 2008 including the specification, drawings and abstract is incorporated herein by reference in its entirety.

BACKGROUND OF THE INVENTION

The present invention relates to chip area reduction techniques for semiconductor devices, and more particularly to a technique useful for layout area reduction in the "PAD on I/O (Input/Output)" cell structure.

In recent years, with the growing demand for low-cost and smaller semiconductor integrated circuit devices, efforts towards cost reduction with smaller semiconductor chip sizes have been made. For smaller chip sizes, it is necessary to reduce the layout area in which components to be packaged are arranged.

One of the known layout area reduction techniques is that pads coupled with bonding wires or the like are overlapped with I/O cells as interfaces with the outside, which is called the "PAD on I/O cell" structure.

SUMMARY OF THE INVENTION

However, the present inventors have found that the PAD on I/O cell technology has the following problem.

In an I/O cell, the output buffer block includes, for example, an output buffer comprised of a P-channel MOS transistor and an N-channel MOS transistor, a first and a second diode for ESD (electrostatic discharge) protection, a first and a second resistance, and an ESD protection circuit.

The first and second diodes for ESD protection are coupled in series between the supply voltage and reference potential. One coupling end of the P-channel MOS transistor is coupled with the supply voltage and the other coupling end of the transistor is coupled with one coupling end of the first resistance.

The other coupling end of the first resistance is coupled with one coupling end of the second resistance and the other coupling end of the second resistance is coupled with one coupling end of the N-channel MOS transistor.

The other coupling end of the N-channel MOS transistor is coupled with the reference potential. The ESD protection circuit is coupled between the supply voltage and reference voltage. A pad is coupled with the junction of the first and second diodes and the junction of the first and second resistances.

Because of restrictions related to bonding with bonding wires, it is difficult to adopt smaller pads, so in order to maximize chip area reduction, it is desirable to maximize the area in which a pad and an I/O cell overlap each other.

However, the above circuit configuration has the following drawback: a pad is coupled with the junction of the first and second resistances and thus the lead part coupled with the pad is forced to lie between these two resistances, and as a consequence, the pad will protrude from the I/O cell and the chip area cannot be reduced effectively.

Another problem is the recent tendency that micro fabrication processes have been increasingly used and wire resistances are high and the resistance of wiring to the ESD protection circuit is also high. As a consequence, the discharge characteristics of the ESD protection circuit may deteriorate, which may cause ESD surge to be discharged to the reference potential through the N-channel MOS transistor located remotely from the ESD protection circuit, resulting in damage to the device.

If the wire resistance is high, one possible approach is to increase the number of ESD protection circuits to protect the device. However, this approach has the problem that the chip area must be larger.

An object of the present invention is to provide a technique that in the "PAD on I/O (Input/Output) cell" structure, the pad lead part is disposed almost in the center of the I/O part (cell) so as to reduce the semiconductor chip layout area.

The above and further objects and novel features of the invention will more fully appear from the following detailed description in this specification and the accompanying drawings.

Preferred embodiments of the invention which will be disclosed herein are briefly outlined below.

According to one aspect of the present invention, there is provided a semiconductor integrated circuit device including a semiconductor chip, in which the semiconductor chip includes a plurality of I/O pads disposed along edges of the semiconductor chip, and a plurality of I/O parts disposed on the semiconductor chip and coupled with any of the I/O pads. The I/O parts each include an output buffer block including an N-channel transistor and a P-channel transistor to form an output buffer and functioning as an interface for output of signals to the outside, and a logic block for controlling the output buffer and an input buffer. In the I/O part, the logic block, the N-channel transistor, and the P-channel transistor are arranged toward an edge of the semiconductor chip in order and a pad lead part to be coupled with the I/O pad lies between the logic block and the N-channel transistor.

In the N-channel transistor, a conductive film may not be formed over part of a main surface of a semiconductor region functioning as a drain, so that a drain terminal of the N-channel transistor can have a high resistance.

The output buffer block may include a first and a second diode for ESD protection and the first and second diodes may lie between the N-channel transistor and P-channel transistor.

The output buffer block may have a resistance for ESD protection and the resistance may lie between the first and second diodes and the P-channel transistor.

Furthermore, in the P-channel transistor, a conductive film may not be formed over part of a main surface of a semiconductor region functioning as a drain, so that a drain terminal of the P-channel transistor can have a high resistance.

Other preferred embodiments of the invention are briefly described below.

According to another aspect of the invention, there is provided a semiconductor integrated circuit device including a semiconductor chip, in which the semiconductor chip includes a plurality of I/O pads disposed along edges of the semiconductor chip, and a plurality of I/O parts disposed on the semiconductor chip and coupled with any of the I/O pads. The I/O parts each include an output buffer block including an N-channel transistor and a P-channel transistor to form an output buffer and functioning as an interface for output of signals to the outside, and a logic block which includes an input buffer block functioning as an interface for input of signals from the outside and controls the output buffer and the input buffer. In the I/O part, the logic block, the P-channel transistor, and the N-channel transistor are arranged in line in order and a pad lead part to be coupled with the I/O pad lies between the logic block and the P-channel transistor.

In the N-channel transistor, a conductive film may not be formed over part of a main surface of a semiconductor region functioning as a drain, so that a drain terminal of the N-channel transistor can have a high resistance.

The output buffer block may include a first and a second diode for ESD protection and the first and second diodes may lie between the N-channel transistor and the P-channel transistor.

The output buffer block may have a resistance for ESD protection and the resistance may lie between the first and second diodes and the P-channel transistor.

Furthermore, in the P-channel transistor, a conductive film may not be formed over part of a main surface of a semiconductor region functioning as a drain, so that a drain terminal of the P-channel transistor can have a high resistance.

The advantageous effects achieved by the preferred embodiments of the present invention as disclosed herein are briefly summarized as follows:

(1) The number of constituent elements of the protection circuit of the output buffer block can be decreased.

(2) The pad area protruding from the I/O part can be considerably reduced so that the chip area of the semiconductor chip can be smaller.

Due to the effects mentioned above in (1) and (2), it is possible to provide a smaller and low-cost semiconductor integrated circuit device.

BRIEF DESCRIPTION OF THE DRAWINGS

FIG. 16 shows an example of the layout of the output buffer block shown in FIG. 15;

FIG. 17 shows an example of the layout of an I/O part according to another embodiment of the invention;

FIG. 18 shows another example of the layout of an I/O part according to another embodiment of the invention;

FIG. 19 shows an example of the layout of an I/O part according to another embodiment of the invention;

DETAILED DESCRIPTION OF THE PREFERRED EMBODIMENTS

Figure 1:
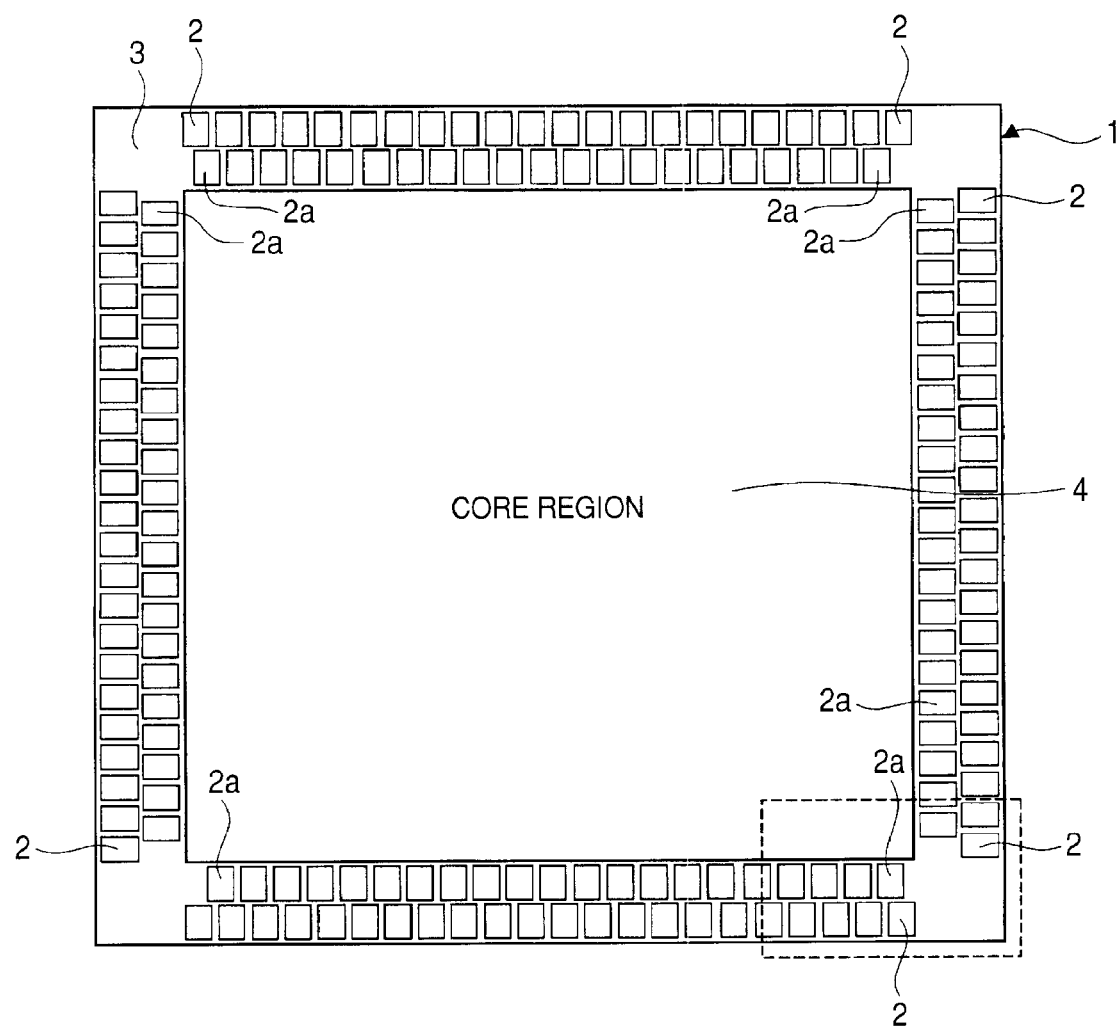
FIG. 1 illustrates the layout of a semiconductor chip according to a first embodiment of the present invention.

Next, the preferred embodiments of the present invention will be described in detail referring to the accompanying drawings. In all the drawings that illustrate the preferred embodiments, elements with like functions are designated by like reference numerals and repeated descriptions of such elements are omitted.

First Embodiment

Figure 2:
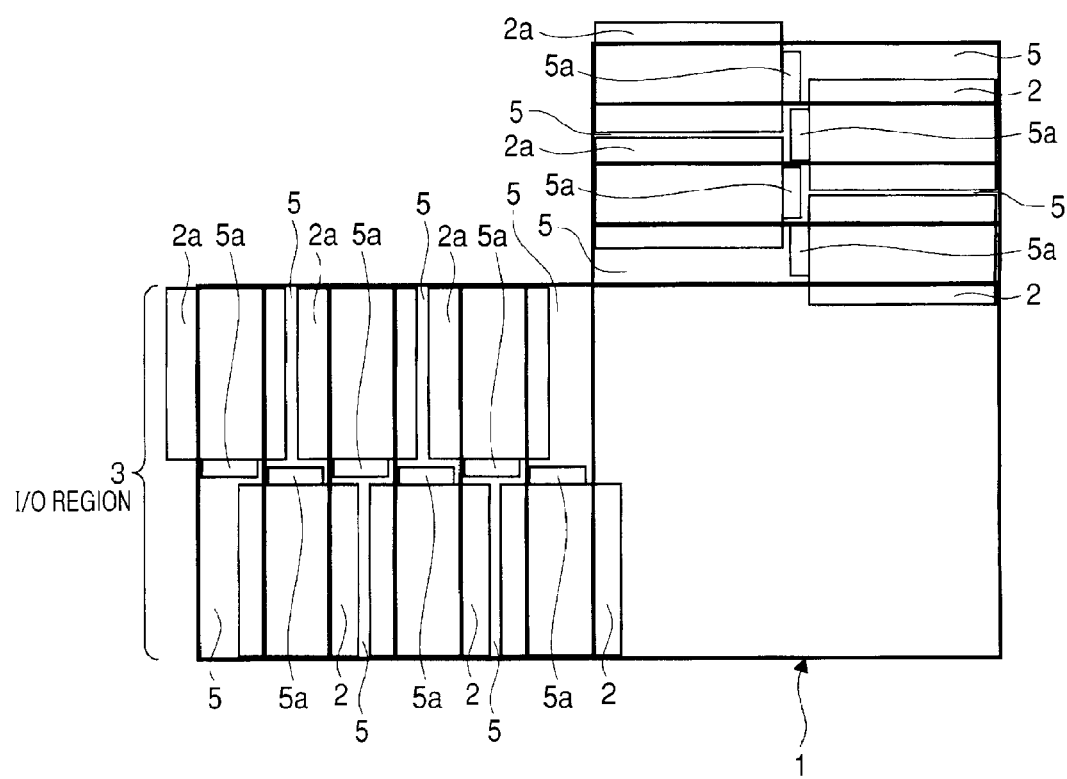
FIG. 2 illustrates pads and part of an I/O region on the semiconductor chip shown in FIG. 1 in enlarged form.
Figure 3:
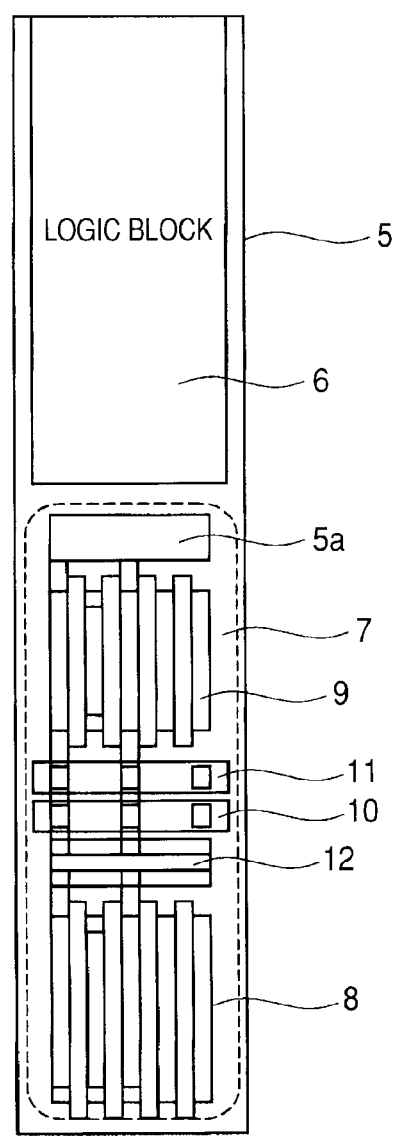
FIG. 3 shows an example of the layout of an I/O part on the semiconductor chip shown in FIG. 1.
Figure 4:
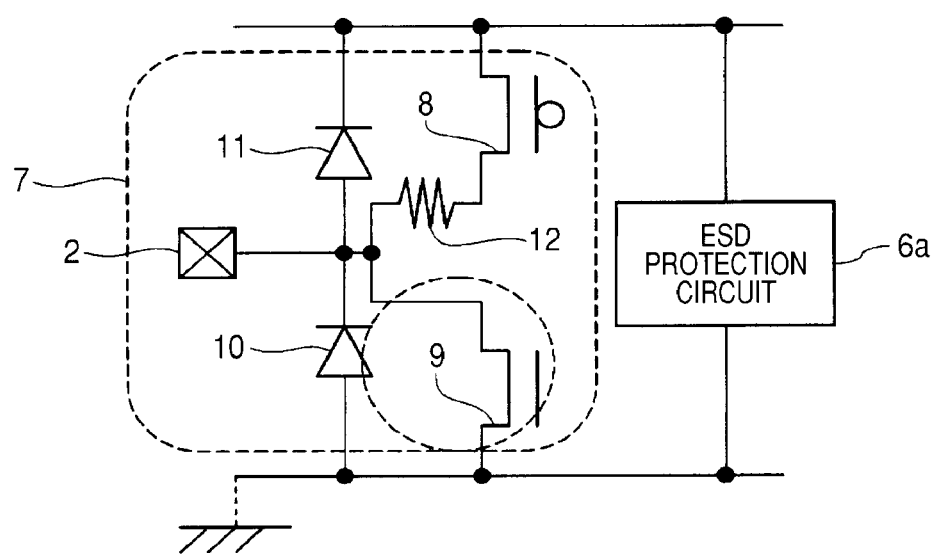
FIG. 4 is a circuit diagram showing an example of the configuration of an output buffer block in the I/O part shown in FIG. 3.
Figure 5:
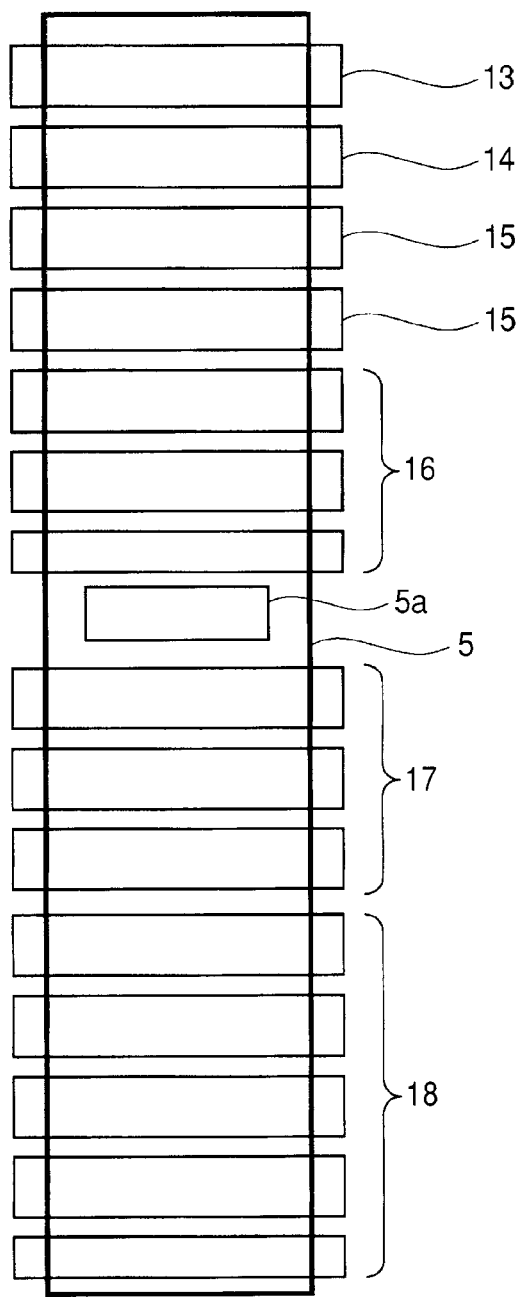
FIG. 5 shows the arrangement of go-round power-supply wires formed in a wiring layer over the I/O part shown in FIG. 3.
Figure 6:
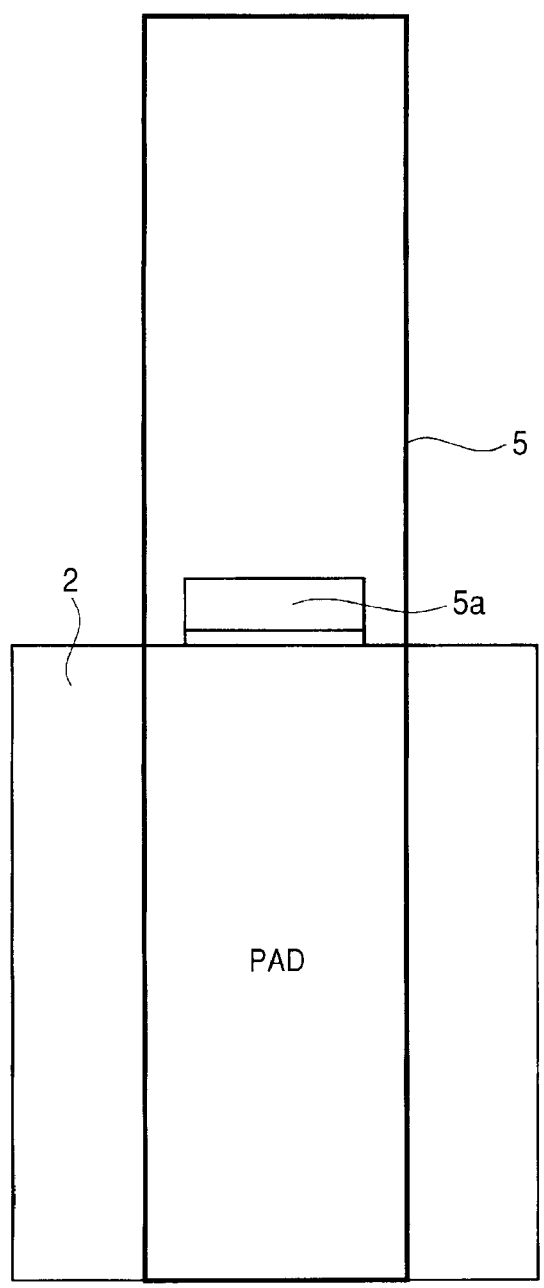
FIG. 6 shows the position of a pad coupled with the I/O part shown in FIG. 3.
Figure 7:
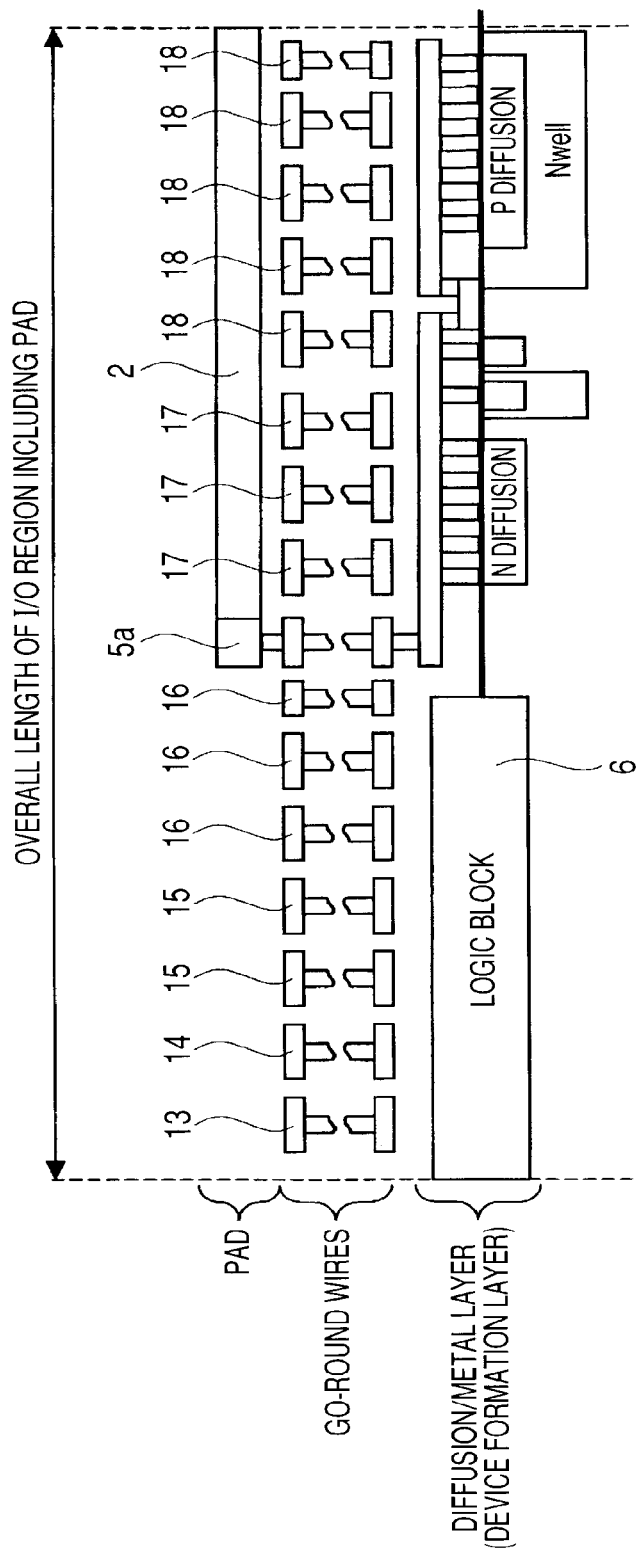
FIG. 7 is a sectional view of the I/O part shown in FIG. 3.
Figure 8:
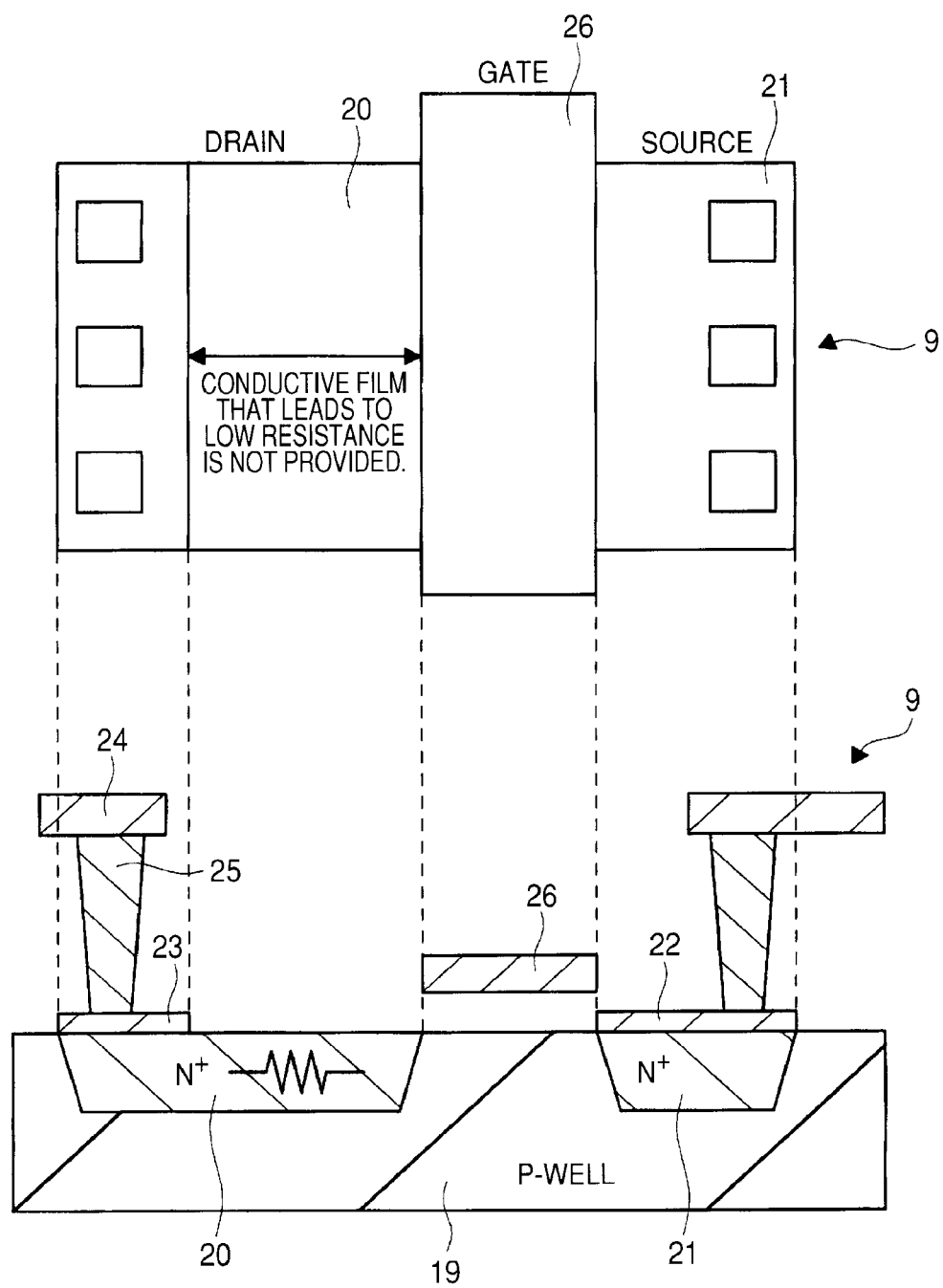
FIG. 8 is a plan view of a transistor provided in the output buffer block shown in FIG. 3, combined with a sectional view thereof.
Figure 9:
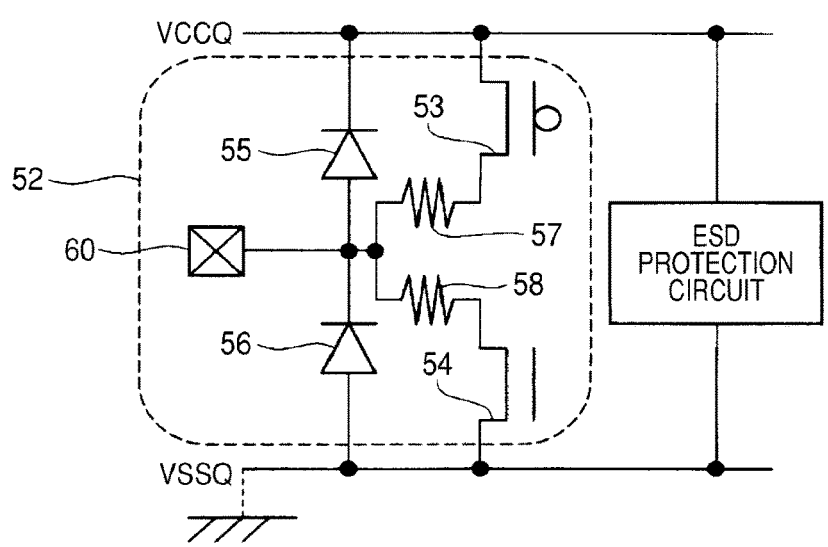
FIG. 9 is a circuit diagram of an ordinary I/O part which the present inventors have examined.
Figure 10:
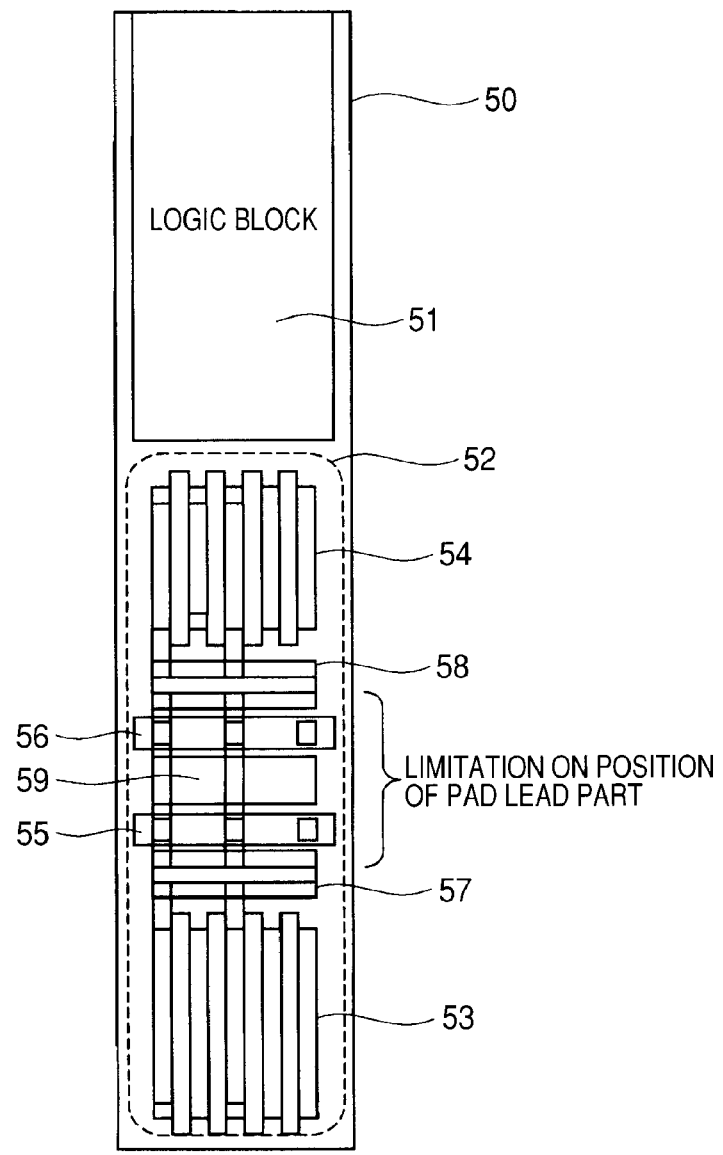
FIG. 10 shows the layout of the output buffer block in the I/O part shown in FIG. 9.
Figure 11:
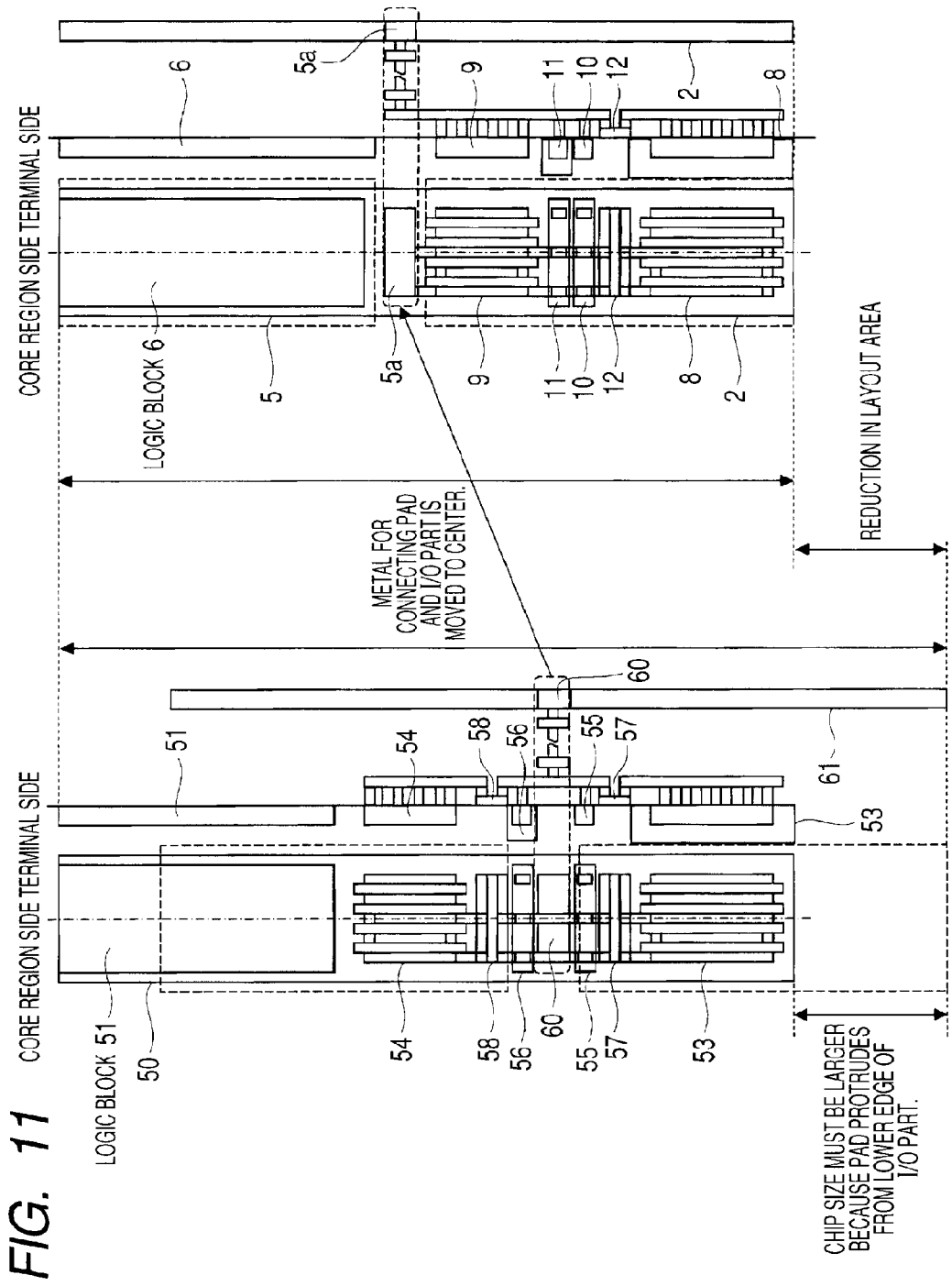
FIG. 11 shows comparison between the I/O part according to the first embodiment of the invention and the ordinary I/O part examined by the present inventors in terms of layout.
Figure 12:
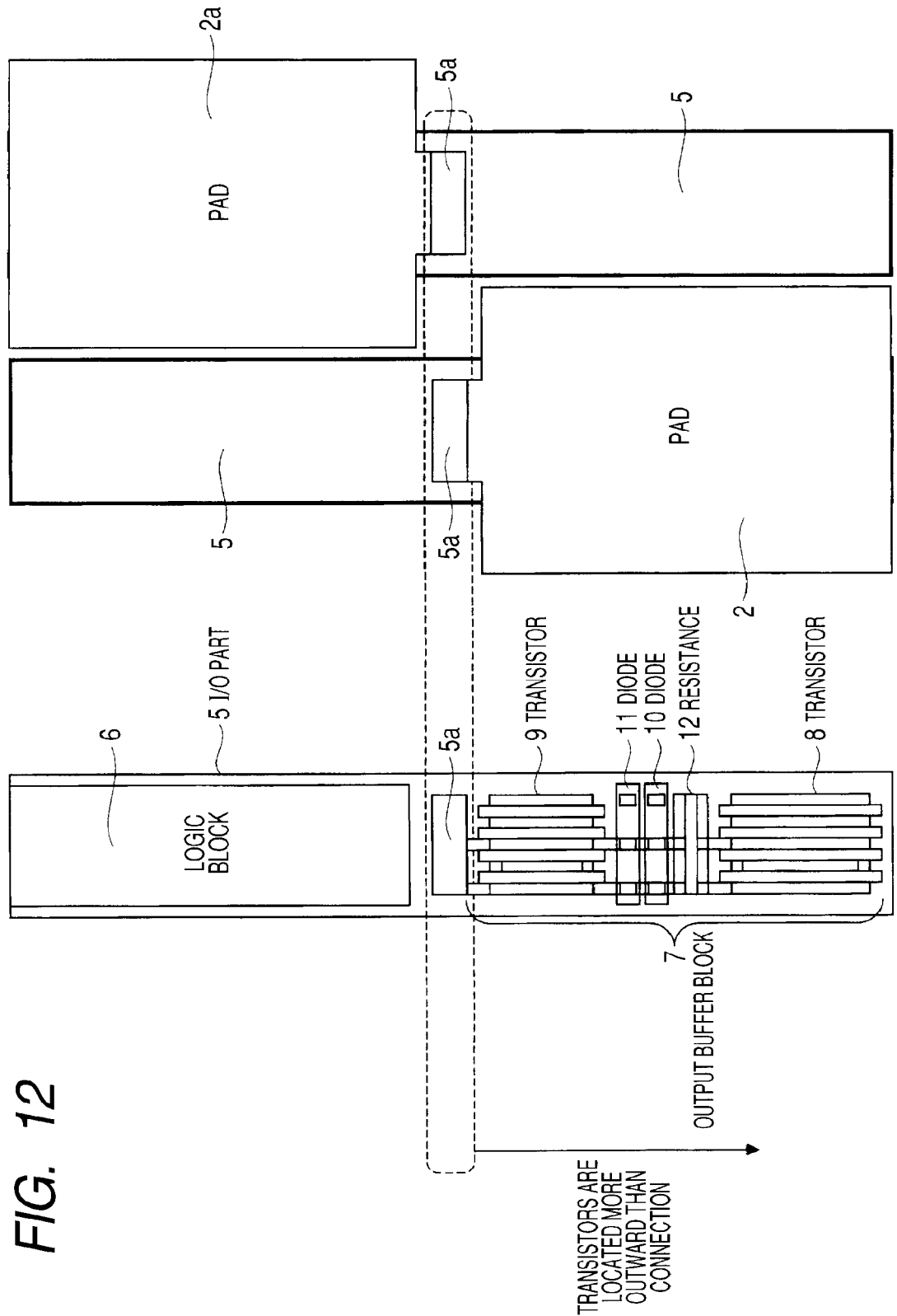
FIG. 12 shows the positional relation between I/O parts and pads according to the first embodiment.

FIG. 1 illustrates the layout of a semiconductor chip according to a first embodiment of the present invention; FIG. 2 illustrates pads and part of an I/O region on the semiconductor chip shown in FIG. 1 in enlarged form; FIG. 3 shows an example of an I/O part on the semiconductor chip shown in FIG. 1; FIG. 4 is a circuit diagram showing an example of the configuration of an output buffer block in the I/O part shown in FIG. 3; FIG. 5 shows the arrangement of go-round power-supply wires formed in a wiring layer over the I/O part shown in FIG. 3; FIG. 6 shows the position of a pad coupled with the I/O part in FIG. 3; FIG. 7 is a sectional view of the I/O part shown in FIG. 3; FIG. 8 is a plan view of a transistor provided in the output buffer block shown in FIG. 3, combined with a sectional view thereof; FIG. 9 is a circuit diagram of an ordinary I/O part which the present inventors have examined; FIG. 10 shows the layout of the output buffer block in the I/O part shown in FIG. 9; FIG. 11 shows comparison between the I/O part according to the first embodiment of the invention and the ordinary I/O part examined by the present inventors in terms of layout; and FIG. 12 shows the positional relation between I/O parts and pads according to the first embodiment.

In the first embodiment, a semiconductor chip 1 which is provided in a semiconductor integrated circuit device has a plurality of pads 2 arranged in lines in four peripheral areas as shown in FIG. 1, in which the pads are coupled, for example, with bonding wires.

Inside the pads 2 which function as I/O pads (or nearer to the center of the semiconductor chip 1), a plurality of pads 2a which also function as I/O pads are arranged in lines, in which the pads 2 and pads 2a are arranged in two rows and in a staggered pattern.

In the semiconductor chip 1, an I/O region 3 as an interface with the outside lies under the pads 2 and 2a, forming a so-called "PAD on I/O" structure. Located in the center of the semiconductor chip 1 is a core region 4 in which a logic circuit including semiconductor elements such as transistors is formed.

FIG. 2 illustrates, in enlarged form, pads 2 and 2*a* and part of the I/O region 3 (area indicated by dotted line in FIG. 1) in the PAD on I/O structure.

In the I/O region 3, a plurality of I/O parts 5 are arranged in a row along each edge of the semiconductor chip 1 and pads 2 and 2*a* are arranged in two rows above them in a staggered pattern. The I/O parts 5 and pads 2 and 2*a* are each rectangular and the long edge of each of the pads 1 and 2*a* is, for example, approximately half of the long edge of the I/O parts 5.

A pad lead part 5*a* is formed on one short edge side of each pad 2 (or 2*a*) and the center of the I/O part 5 is coupled with the corresponding pad 2 (or pad 2*a*) through the part lead part 5*a*.

FIG. 3 shows an example of the layout of the I/O part 5 and FIG. 4 is a circuit diagram showing an example of the configuration of an output buffer block 7 provided in the I/O part 5.

As shown in FIG. 3, the I/O part 5 includes a logic block 6 and an output buffer block 7. For example, the logic block 6 includes an ESD protection circuit 6*a* (shown in FIG. 4), an input buffer block for input buffer, a level shifter for voltage level shift, and an inverter for sending a drive signal to the output buffer block 7.

As shown in FIG. 4, the output buffer block 7 includes transistors 8 and 9 for output buffer, diodes 10 and 11 for ESD protection, and a resistance 12 for ESD protection. For example, the transistor 8 is a P-channel MOS transistor and the transistor 9 is an N-channel MOS transistor.

The diodes 10 and 11 are coupled in series between supply voltage VCCQ and reference potential VSSQ. One coupling end of the transistor 8 is coupled with the supply voltage VCCQ and the other coupling end of the transistor 8 is coupled with one coupling end of the resistance 12.

The other coupling end of the resistance 12 is coupled with one coupling end of the transistor 9 and the other coupling end of the transistor 9 is coupled with the reference potential VSSQ. The junction of the diode 10, a first diode, and the diode 11, a second diode, and the junction of the other coupling end of the resistance 12 and the one coupling end of the transistor 9 form an output part for the output buffer block 7 which is coupled with a pad 2 (or pad 2*a*).

Also, as shown in FIG. 3, the transistor 8 is located nearest to the periphery of the semiconductor chip 1 in the I/O part 5. When seen in the plan view (FIG. 3), the resistance 12 lies above the transistor 8 and the diodes 10 and 11 lie above the resistance 12.

The transistor 9 lies above the diodes 10 and 11, and the logic block 6 lies above the transistor 9 with the pad lead part 5*a*, for example, formed in a metal wiring layer between them.

FIG. 5 shows the arrangement of go-round power-supply wires formed over the I/O part 5 shown in FIG. 3.

From top to bottom in FIG. 5, the go-round power-supply wires are arranged as follows: go-round wire for core supply voltage 13, go-round wire for core reference potential 14, go-round wires for I/O supply voltage 15, and go-round wires for I/O reference potential 16 are arranged over the logic block 6; and go-round wires for I/O reference potential 17 and go-round wires for I/O supply voltage 18 are arranged over the output buffer block 7, with the pad lead part 5*a* between the two groups of go-round wires.

The go-round wire for core supply voltage 13 feeds the supply voltage to the core region 4 and the go-round wire for core reference potential 14 feeds the reference potential to the core region 4. The go-round wires for I/O supply voltage 15 and 18 feed supply voltage VCCQ to the I/O part 5 and the go-round wires for I/O reference potential 16 and 17 feeds reference potential VSSQ to the I/O part 5.

FIG. 6 shows the position of the pad 2 coupled with the I/O part 5 shown in FIG. 5.

This pad 2 is one of the pads located on the outer side (the peripheral side of the semiconductor chip 1) among the pads 2 arranged in a staggered pattern and the pad 2 is in such a position that it does not protrude from the short edge of the I/O part 5 on the peripheral side of the semiconductor chip 1.

FIG. 7 is a sectional view of the I/O part 5 shown in FIG. 3.

In the device formation layer at the bottom, the logic block 6, and the transistor 9, diode 11 and diode 10, resistance 12 and transistor 8 of the output buffer block 7 are formed from left to right in FIG. 7.

In the wiring layer lying over the device formation layer, the go-round wire for core supply voltage 13, the go-round wire for core reference potential 14, go-round wires for I/O supply voltage 15, go-round wires for I/O reference potential 16, go-round wires for I/O reference potential 17, and go-round wires for I/O supply voltage 18 are formed from left to right in FIG. 7.

In the pad formation layer, the pad lead part 5*a* and pad 2 are formed. The pad lead part 5*a* and pad 2 are so formed that they lie over the output buffer block 7 formed in the device formation layer.

The transistor 9 (indicated by the dotted line circle in FIG. 4) is manufactured in a way that a conductive film is not formed in part of the diffusion layer, in order for the drain of the transistor 9 to have a high resistance.

FIG. 8 is a plan view of the transistor 9, combined with a sectional view thereof.

For example, in the transistor 9, a P-well 19 is formed over a semiconductor substrate, and an N+ type semiconductor region 20 functioning as a drain and an N+ type semiconductor region 21 functioning as a source are formed on the right and left over the P-well 19.

Formed over the N+ type semiconductor region 21 is a conductive film which is a metal silicide 22 such as cobalt silicide or nickel silicide. On the other hand, a metal silicide 23 is formed over the N+ type semiconductor region 20 as well, though the region 20 is not all covered by the metal silicide 23 unlike the N+ type semiconductor region 21 and the metal silicide 23 is only formed over part of the region 20 which is coupled with a via 25 for coupling with a wire 24 formed in the overlying wiring layer.

As a consequence, the sheet resistance can be increased, for example, to a level approximately 10 to 50 times higher than when a metal silicide is formed all over the N+ type semiconductor region 20. In addition, a gate 26 is formed over the P-well 19 through an insulating film such as silicon oxide.

Due to the absence of the metal silicide 23 over part of the N+ type semiconductor region 20 as mentioned above, the drain terminal can have a high resistance so that the transistor 9 is protected from ESD.

FIG. 9 is a circuit diagram of an ordinary I/O part 50 which the present inventors have examined.

The I/O part 50 (shown in FIG. 10) includes a logic block 51 (FIG. 10) and an output buffer block 52. For example, the logic block 51 includes an ESD protection circuit, an input buffer block for input buffer, a level shifter for voltage level shift, and an inverter for sending a drive signal to the output buffer block 52.

The output buffer block 52 includes transistors 53 and 54 for output buffer, diodes 55 and 56 for ESD protection, and resistances 57 and 58 for ESD protection.

For example, the transistor 53 is a P-channel MOS transistor and the transistor 54 is an N-channel MOS transistor. The diodes 55 and 56 are coupled in series between supply voltage VCCQ and reference potential VSSQ.

One coupling end of the transistor 53 is coupled with the supply voltage VCCQ and the other coupling end of the transistor 53 is coupled with one coupling end of the resistance 57. The other coupling end of the resistance 57 is coupled with one coupling end of the resistance 58 and the other coupling end of the resistance 58 is coupled with one coupling end of the transistor 54.

The other coupling end of the transistor 54 is coupled with the reference potential VSSQ. The junction of the diode 55 and diode 56 and the junction of the resistance 53 and resistance 54 are coupled with a pad lead part 59 which forms an output part for the output buffer block 52.

FIG. 10 shows the layout of the output buffer block 52 in the I/O part 50 shown in FIG. 9.

When seen in the plan view (FIG. 10), in the I/O part 50, the logic block 51 lies in an upper part of the figure and the transistor 54 of the output buffer block 52 lies below the logic block 51. The resistance 58 lies below the transistor 54 and the diode 56 lies below the resistance 58.

The diode 55 lies below the diode 56 with the pad lead part 59 between them. The resistance 57 lies below the diode 55 and the transistor 53 lies below the resistance 57.

In this circuit configuration, the pad lead part 59 to be coupled with a pad 60 can only be placed between the resistance 57 and resistance 58 and as a consequence, the pad lead part 59 should be located off the center of the I/O part 50, resulting in a protrusion from the short edge of the I/O part 50 as shown on the left in FIG. 11. This leads to a larger semiconductor chip.

On the other hand, in the case of the I/O part 5, the structure of the transistor 9 shown in FIG. 8 eliminates the need for a resistance equivalent to the resistance 58 and permits the pad 2 (or pad 2a) through the drain of the transistor 9 to be on the same node, so the pad lead part 5a can be disposed almost in the center of the I/O part 5 as shown on the right in FIG. 11.

Since the pad lead part 5a is located almost in the center of the I/O part 5, as shown in FIG. 12, the pads 2 on the outer side (on the peripheral side of the semiconductor chip 1) among the pads arranged in a staggered pattern can be moved toward the center of the semiconductor chip 1 and the inner pads 2a located nearer to the center of the semiconductor chip 1 than the pads 2 can be moved toward the outer peripheral side of the semiconductor chip 1.

Therefore, the pads 2 and 2a can be located inside the I/O part 5 without the need for decreasing the size of the pads 2 and 2a.

In addition, since the diodes 10 and 11 and the resistance 12 are placed between the transistors 8 and 9, the distance between the transistors 8 and 9 can be increased, so latch-up phenomena due to parasitic thyristors (SCR) is prevented and the reliability is improved.

Consequently, according to the first embodiment, the protection circuit in the output buffer block 7 can be smaller.

Furthermore, since the pads 2 and 2a are arranged in an overlaid manner, so as not to protrude from the I/O part 5, the chip area of the semiconductor chip 1 can be decreased, making it possible to realize a smaller and low-cost semiconductor integrated circuit device.

Although the transistor 9, diode 11, diode 10, resistance 12 and transistor 8 are arranged in order from top to bottom when seen in the plan view of FIG. 3 in the first embodiment, the order of arrangement may be altered.

Figure 13:
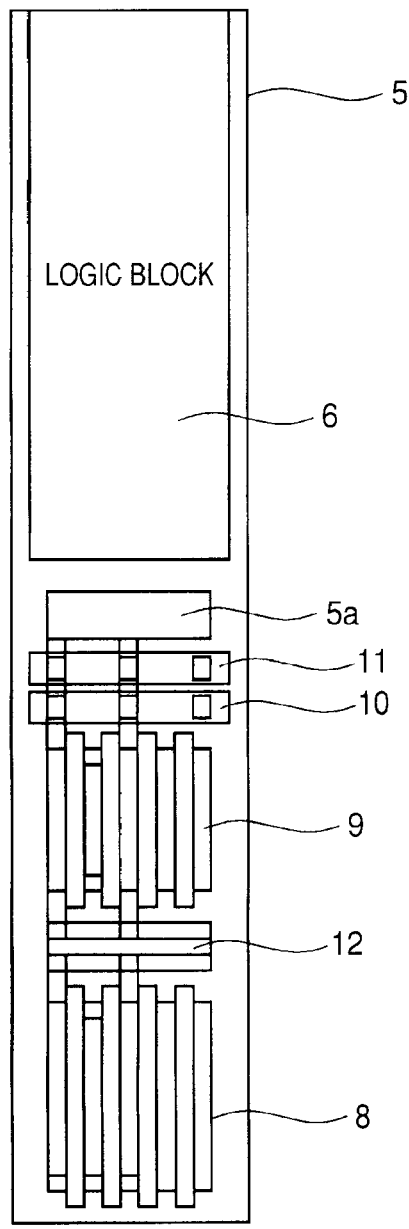
FIG. 13 shows an example of the layout of an I/O part according to another embodiment of the invention.
Figure 14:
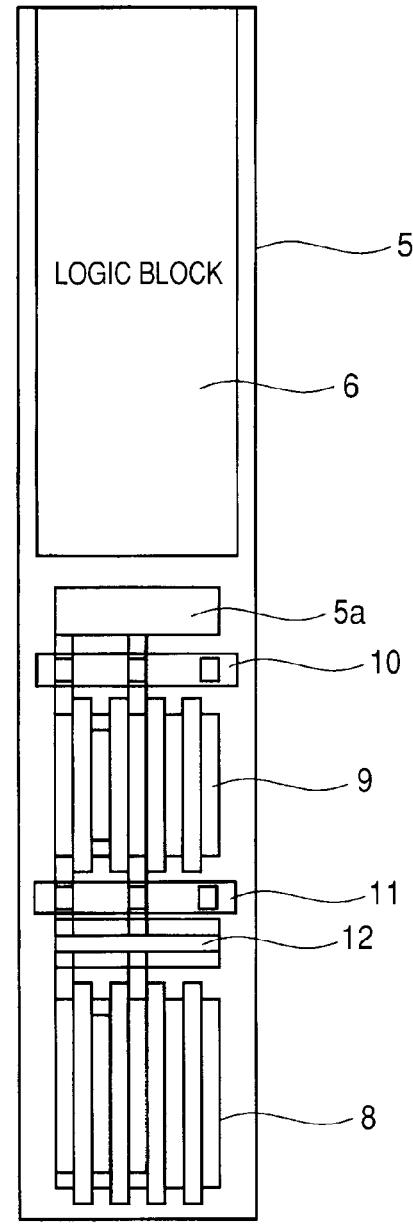
FIG. 14 shows another example of the layout of an I/O part according to another embodiment of the invention.

The layout of the output buffer block may be altered as follows: the diode 11, diode 10, transistor 9, resistance 12, and transistor 8 are arranged from top to bottom as shown in FIG. 13 or the diode 10, transistor 9, diode 11, resistance 12, and transistor 8 are arranged from top to bottom as shown in FIG. 14.

Second Embodiment

Figure 15:
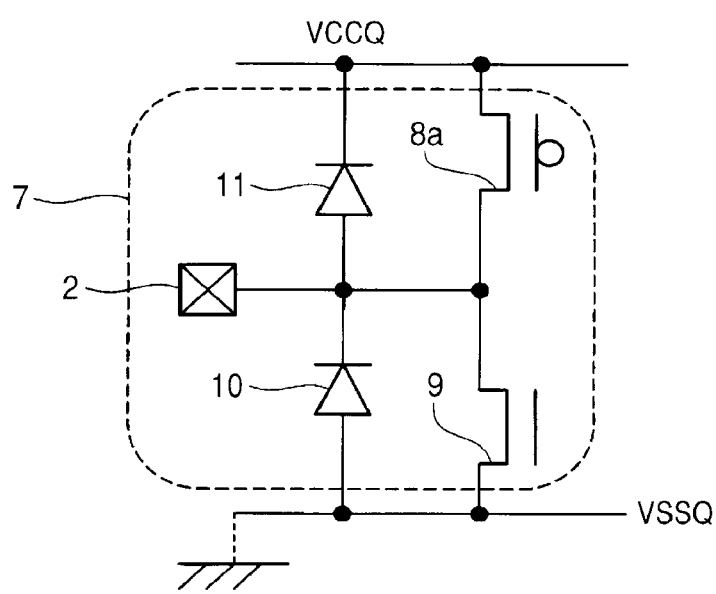
FIG. 15 is a circuit diagram showing an example of the configuration of an output buffer block according to a second embodiment of the present invention.

FIG. 15 is a circuit diagram showing an example of the configuration of an output buffer block 7 according to a second embodiment of the present invention and FIG. 16 shows an example of the layout of the output buffer block shown in FIG. 15.

In the second embodiment, the semiconductor chip 1 is the same as the one shown in FIG. 1 in the aforementioned embodiment except the structure of the output buffer block 7 provided in the I/O part 5. As shown in FIG. 15, the output buffer block 7 includes diodes 10 and 11 and transistors 8a and 9.

The diodes 10 and 11 are coupled in series between supply voltage VCCQ and reference potential VSSQ. One coupling end of the transistor 8a, a P-channel MOS transistor, is coupled with the supply voltage VCCQ and the other coupling end of the transistor 8a is coupled with one coupling end of the transistor 9, an N-channel MOS transistor.

The other coupling end of the transistor 9 is coupled with the reference potential VSSQ. The junction of the diode 10 and diode 11, and the junction of the transistor 8a and transistor 9 form an output part for the output buffer block 7 which is coupled with a pad 2 or pad 2a.

In this structure, not only in the transistor 9 but also in the transistor 8a, a metal silicide film is not formed over part of the upper surface of the N+ type semiconductor region which functions as a drain, so that the drain terminal has a high resistance.

Consequently, since the drain terminal of the transistor 8a can have the same function as the resistance 12 (FIG. 4), the resistance 12 is no longer needed.

FIG. 16 illustrates an example of the layout of the I/O part 5.

When seen in the plan view (FIG. 16), in the I/O part 5, the logic block 6 lies in an upper part of the figure and the transistor 9 lies below the logic block 6 with the pad lead part 5a between them. The diodes 10 and 11 lie below the transistor 9, and the transistor 8a lies below the diodes.

In this case as well, the pad lead part 5a can be located almost in the center of the I/O part 5, so the chip area of the semiconductor chip 1 (FIG. 1) can be smaller. This also eliminates the need for the resistance 12 (FIG. 4), which means that the circuit of the output buffer block 7 can be even smaller.

The layout of the output buffer block 7 as shown in FIG. 16 maybe varied as follows: for example, as show in FIG. 17, the diodes 11 and 10 lie between the transistor 8a and transistor 9 and their positions are reversed or as shown in FIG. 18, the diodes 10 and 11 lie between the logic block 6 and the transistor 9 with the pad lead part 5a between them.

Figure 20:
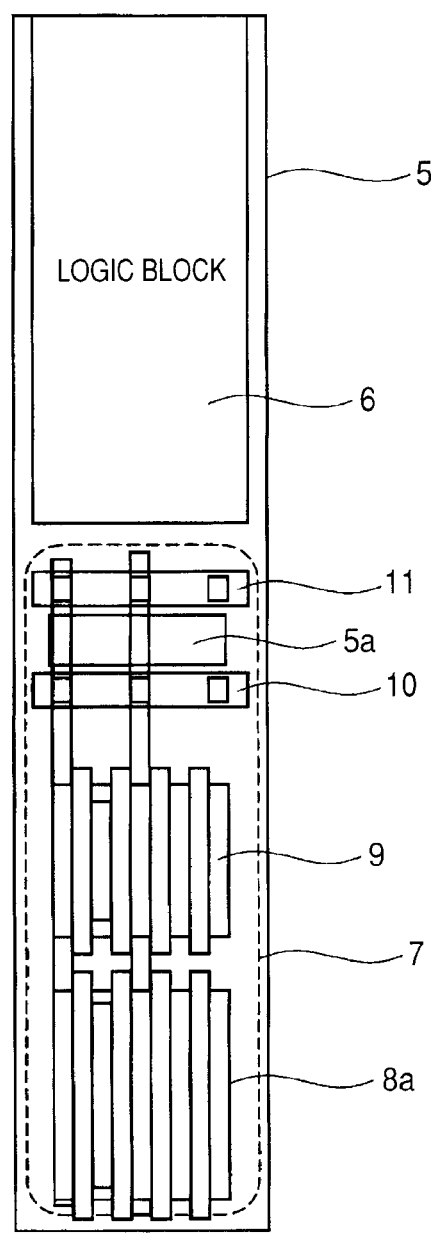
FIG. 20 shows another example of the layout of an I/O part according to another embodiment of the invention.

Another possible layout of the output buffer block 7 is that as shown in FIG. 19, the pad lead part 5a lies between the diodes 11 and 10 and the transistor 9 or as shown in FIG. 20, the pad lead part 5a lies between the diode 11 and diode 10.

Third Embodiment

Figure 21:
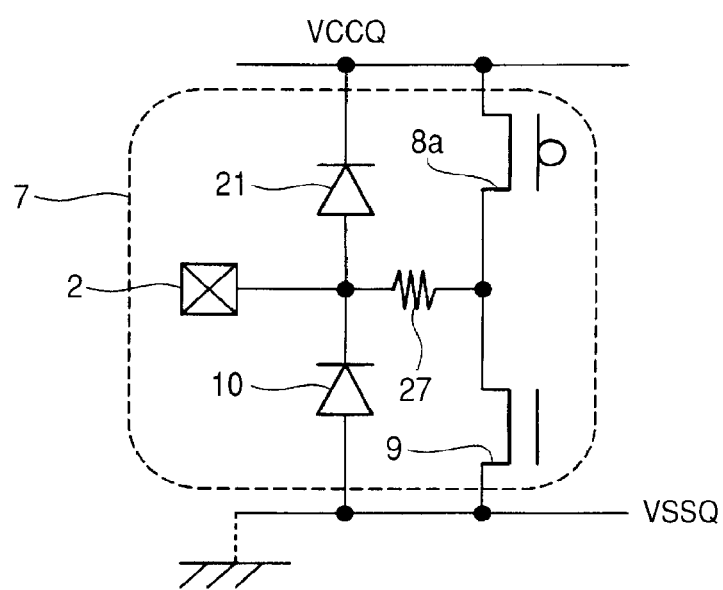
FIG. 21 is a circuit diagram showing an example of an output buffer block according to a third embodiment of the present invention.
Figure 22:
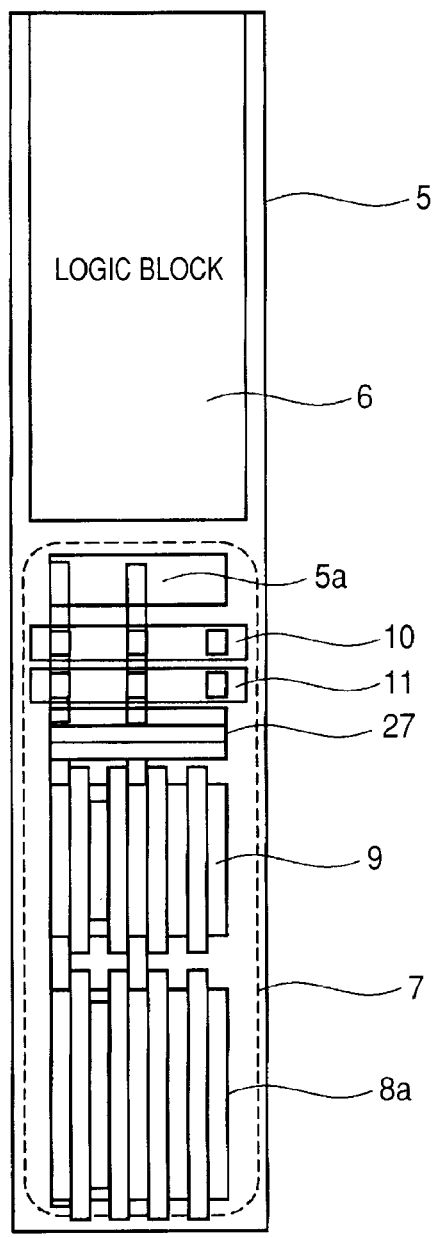
FIG. 22 shows an example of the layout of the output buffer block shown in FIG. 21.

FIG. 21 is a circuit diagram showing an example of an output buffer block according to a third embodiment of the present invention and FIG. 22 shows an example of the layout of the output buffer block shown in FIG. 21.

In the third embodiment, as shown in FIG. 21, the circuit of the output buffer block includes a resistance 27 in addition to the diodes 10 and 11 and transistors 8a and 9 included in the second embodiment as shown in FIG. 15.

One coupling end of the resistance 27 is coupled with the junction of the diodes 10 and 11 and the other coupling end of the resistance 27 is coupled with the junction of the transistor 8a and transistor 9. The other elements are coupled in the same way as those in the second embodiment as shown in FIG. 15.

FIG. 22 illustrates an example of the layout of the I/O part 5.

When seen in the plan view (FIG. 22), in the I/O part 5, the logic block 6 lies in an upper part of the figure and the diode 10 and diode 11 lie below the logic block 6 with the pad lead part 5a between the logic block and the diodes.

The resistance 27 lies below the diode 11 and the transistor 9 lies below the resistance 27, and the transistor 8 lies below the transistor 9.

In this case as well, the pad lead part 5a can be located almost in the center of the I/O part 5, so the chip area of the semiconductor chip 1 (FIG. 1) can be smaller.

Figure 23:
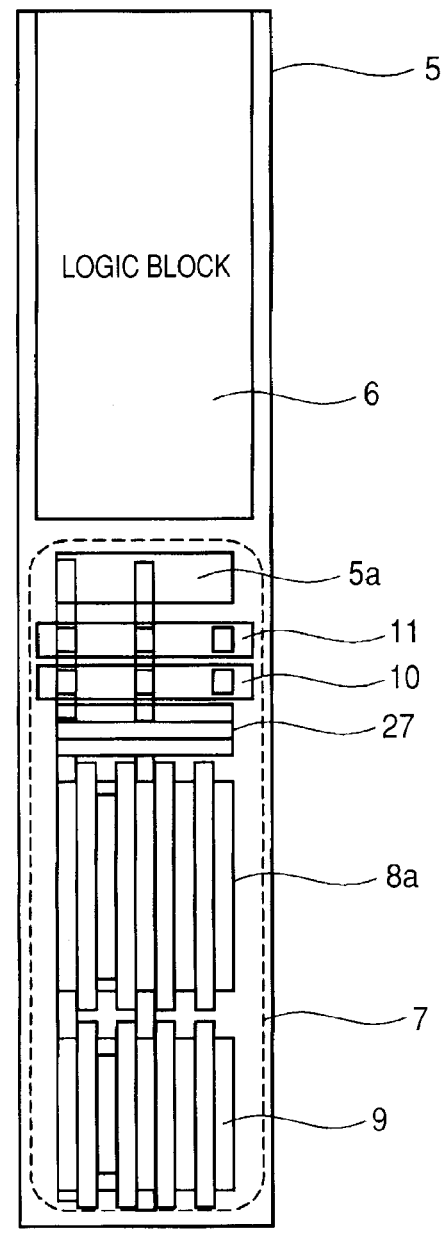
FIG. 23 shows an example of the layout of an output buffer block according to another embodiment of the invention.

The layout of the output buffer block 7 as shown in FIG. 22 may be varied as follows: for example, as shown in FIG. 23, the positions of the transistor 8a and transistor 9 are reverse to those shown in FIG. 22.

The invention made by the present inventors has been so far detailed in reference to the preferred embodiments thereof. However, the invention is not limited to such embodiments and it is obvious that these details maybe modified in various ways without departing from the spirit and scope of the invention.

The present invention is suitable as a chip area reduction technique for semiconductor integrated circuit devices with a "PAD on I/O (Input/Output)" cell structure.

What is claimed is:

1. A semiconductor integrated circuit device comprising a semiconductor chip, the semiconductor chip comprising:
   a core region including logic circuits having semiconductor elements;
   an I/O region arranged around the core region;
   a first and a second I/O pad formed in the I/O region;
   a first and a second I/O part formed in the I/O region and disposed adjacently to each other along one side of the semiconductor chip and coupled with the first and the second I/O pad, respectively,
   the first and the second I/O part in the I/O region, each comprising:
      an output buffer block including an N-channel transistor, a P-channel transistor, and a resistor for ESD protection to form an output buffer and functioning as an interface for output of signals to the outside;
      a logic block for controlling the output buffer block and an input buffer block; and
      a pad lead part disposed between the logic block and the N-channel transistor;
   at first wire for supply voltage and a second wire for reference potential extending along the one side of the semiconductor chip and formed above the output buffer block of the first I/O part and the output buffer block of the second I/O part; and
   a third wire for supply voltage and a fourth wire for reference potential extending along the one side of the semiconductor chip and formed above the logic block of the first I/O part and the logic block of the second I/O part,
   wherein in each of the first and the second I/O parts, in plan view, the logic block, the pad lead part, the N-channel transistor, and the P-channel transistor are arranged in this order starting from a position closer to a center of the semiconductor chip toward an edge of the semiconductor chip,
   wherein, in plan view, the resistor is arranged between the N-channel transistor and the P-channel transistor,
   wherein a drain terminal of the P-channel transistor is connected to a drain terminal of the N-channel transistor via the resistor,
   wherein the pad lead part is coupled with a connection part of the drain terminal of the N-channel transistor and the resistor,
   wherein in the N-channel transistor a conductive film is not formed over part of a main surface of a semiconductor region functioning as a drain,
   wherein, in plan view, the first I/O pad is overlapped with the output buffer block of the first I/O part,
   wherein, in plan view, the second I/O pad is overlapped with the logic block of the second I/O part,
   wherein, in plan view, the pad lead part of the first I/O part and the pad lead part of the second I/O part are arranged in parallel with a direction along the one side of the semiconductor chip, and
   wherein, in each of the first and second I/O parts, in plan view, the third wire, the fourth wire, the pad lead part, the second wire, and the first wire are arranged in this order starting from the position closer to the center of the semiconductor chip toward the edge of the semiconductor chip.

2. The semiconductor integrated circuit device according to claim 1, wherein the N-channel transistor and the P-channel transistor receive a drive signal from the logic block.

3. The semiconductor integrated circuit device according to claim 1, wherein the resistor is connected to the drain terminal of the P-channel transistor.

4. The semiconductor integrated circuit device according to claim 1,
   wherein the output buffer block includes a first and a second diode for ESD protection, and
   wherein the first and the second diode lies between the N-channel transistor and the resistor.

5. The semiconductor integrated circuit device according to claim 1,
   wherein, in plan view, in each of the first and second I/O parts, the pad lead part is not overlapped with either the third wire or the fourth wire.

6. A semiconductor integrated circuit device comprising a semiconductor chip,
   the semiconductor chip comprising:
      a core region including logic circuits having semiconductor elements;
      an I/O region arranged around the core region;
      a first, a second, and a third I/O pad formed in the I/O region;
      a first, a second, and a third I/O part formed in the I/O region and disposed in this order along an edge of the semiconductor chip and coupled with the first, the second, and the third I/O pad, respectively,
   the first, the second, and the third I/O part in the I/O region, each comprising:

an output buffer block including an N-channel transistor, a P-channel transistor, and a resistor for ESD protection to form an output buffer and functioning as an interface for output of signals to the outside;

a logic block for controlling the output buffer block and an input buffer block; and a pad lead part disposed between the logic block and the N-channel transistor;

a first wire for supply voltage and a second wire for reference potential extending along one side of the semiconductor chip and formed above the output buffer block of the first I/O part, the output buffer block of the second I/O part and the output buffer block of the third I/O part; and a third wire for supply voltage and a fourth wire for reference potential extending along the one side of the semiconductor chip and formed above the logic block of the first I/O part, the logic block of the second I/O part and the logic block of the third I/O part, wherein in each of the first and the second I/O parts:

in plan view, the logic block, the pad lead part, the N-channel transistor, and the P-channel transistor are arranged in this order starting from a position closer to a center of the semiconductor chip toward the edge of the semiconductor chip, in plan view, the resistor is arranged between the N-channel transistor and the P-channel transistor, a drain terminal of the P-channel transistor is connected to a drain terminal of the N-channel transistor via the resistor, the pad lead part is coupled with a connection part of the drain terminal of the N-channel transistor and the resistor, and in the N-channel transistor a conductive film is not formed over part of a main surface of a semiconductor region functioning as a drain, wherein, in plan view, the first I/O pad is overlapped with the output buffer block of the first I/O part, wherein, in plan view, the second I/O pad is overlapped with the logic block of the second I/O part, wherein, in plan view, the third I/O pad is overlapped with the output buffer block of the third I/O part, wherein, in plan view, the pad lead part of the second I/O part is arranged between the pad lead part of the first I/O part and the pad lead part of the third I/O part, and the pad lead part of the first I/O part, the pad lead part of the second I/O part, and the pad lead part of the third I/O part are arranged in parallel with a direction along the edge of the semiconductor chip along which the first, second, and third I/O parts are disposed, and wherein in each of the first, second and third I/O parts, in plan view, the third wire, the fourth wire, the pad lead part, the second wire, and the first wire are arranged in this order starting from the position closer to the center of the semiconductor chip toward the edge the semiconductor chip.

7. The semiconductor integrated circuit device according to claim 6, wherein, in plan view, in each of the first, second and third I/O parts, the pad lead part is not overlapped with either the third wire or the fourth wire.

\* \* \* \* \*